US008946752B2

(12) United States Patent
Kawase et al.

(10) Patent No.: US 8,946,752 B2
(45) Date of Patent: Feb. 3, 2015

(54) SEMICONDUCTOR LIGHT EMITTING DEVICE

(71) Applicant: Rohm Co., Ltd., Kyoto (JP)

(72) Inventors: Tomohito Kawase, Kyoto (JP); Toshikuni Shinohara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/017,957

(22) Filed: Sep. 4, 2013

(65) Prior Publication Data
US 2014/0070253 A1 Mar. 13, 2014

(30) Foreign Application Priority Data

Sep. 11, 2012 (JP) ................... 2012-199629

(51) Int. Cl.
H01L 33/46 (2010.01)
H01L 33/00 (2010.01)
H01L 33/10 (2010.01)
H01L 33/22 (2010.01)

(52) U.S. Cl.
CPC .......... *H01L 33/465* (2013.01); *H01L 33/0091* (2013.01); *H01L 33/10* (2013.01); *H01L 33/22* (2013.01)
USPC .......................................................... 257/98

(58) Field of Classification Search
CPC ... H01L 33/465; H01L 33/10; H01L 33/0091; H01L 33/22
USPC .................................................. 257/98, 88, 79
See application file for complete search history.

(56) References Cited

U.S. PATENT DOCUMENTS

| 6,348,096 | B1 | 2/2002 | Sunakawa et al. |
| 7,071,494 | B2* | 7/2006 | Steigerwald et al. ........... 257/98 |
| 2003/0057444 | A1 | 3/2003 | Niki et al. |
| 2004/0113163 | A1* | 6/2004 | Steigerwald et al. ........... 257/88 |
| 2006/0065895 | A1* | 3/2006 | Kusunoki et al. ............... 257/66 |

* cited by examiner

Primary Examiner — Nikolay Yushin
(74) Attorney, Agent, or Firm — Rabin & Berdo, P.C.

(57) ABSTRACT

The semiconductor device includes a substrate, a semiconductor layer which is formed on the substrate and includes a light emitting layer, and a diffraction/scattering film for diffracting or scattering light generated at the light emitting layer. The diffraction/scattering film is formed between the light emitting layer and the substrate, has a side surface slanted with respect to a film thickness direction thereof, and has a composition gradient in the film thickness direction.

14 Claims, 12 Drawing Sheets

SEMICONDUCTOR LIGHT EMITTING DEVICE

BACKGROUND OF THE INVENTION

1. Field of the Invention

The present invention relates to a semiconductor light emitting device including a light emitting layer in a semiconductor layer formed on a substrate.

2. Description of Related Art

US2003/0057444A1 discloses a semiconductor light emitting device in which a protruding portion for scattering or diffracting light generated at a GaN series semiconductor layer is formed at a substrate surface portion in order to improve the external quantum efficiency. A side surface of the protruding portion is slanted at a taper angle of 90° to 150°, which is described as leading to dramatic improvement in light extraction efficiency.

U.S. Pat. No. 6,348,096B1 discloses a method for forming an $SiO_2$ mask on a GaN substrate and causing selective epitaxial growth of GaN so as to form a GaN epitaxial layer having less dislocation.

SUMMARY OF THE INVENTION

The present inventors considered usage of a mask described in U.S. Pat. No. 6,348,096 B1 as a protruding portion formed in US 2003/0057444 A1.

However, it was difficult to obtain a mask having a slanted side surface with stable reproducibility, and it was therefore impossible to manufacture a semiconductor light emitting device having stable device characteristics.

More specifically, the present inventor tried to form a photoresist mask having a slanted side surface on a mask film and etch the mask film by plasma etching using the photoresist mask as an etching mask. This produced a mask film having a slanted side surface. The photoresist mask having a slanted side surface was formed by heat treatment following formation of a pattern of a photoresist film, aiming at contraction of the photoresist.

However, a photoresist mask formed in such a process is subjected to influence of heat distribution in a wafer, and therefore the angle of a slanted surface varies in the wafer. In accordance with the variation, the slant of a side surface of the mask film also varies in the wafer.

This variation causes variation in characteristics of devices cut out from respective portions of the wafer, especially in light extraction efficiency. Thus, there is a possibility that a device having constant characteristics cannot be prepared with high reproducibility.

Hence, the present invention provides a semiconductor light emitting device which can achieve excellent light extraction efficiency with high reproducibility.

A semiconductor light emitting device of the present invention includes a substrate, a semiconductor layer which is formed on the substrate and includes a light emitting layer, and a diffraction/scattering film, which is formed between the light emitting layer and the substrate, for diffracting or scattering light generated at the light emitting layer, the diffraction/scattering film having a side surface slanted with respect to a film thickness direction thereof and having a composition gradient in the film thickness direction.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
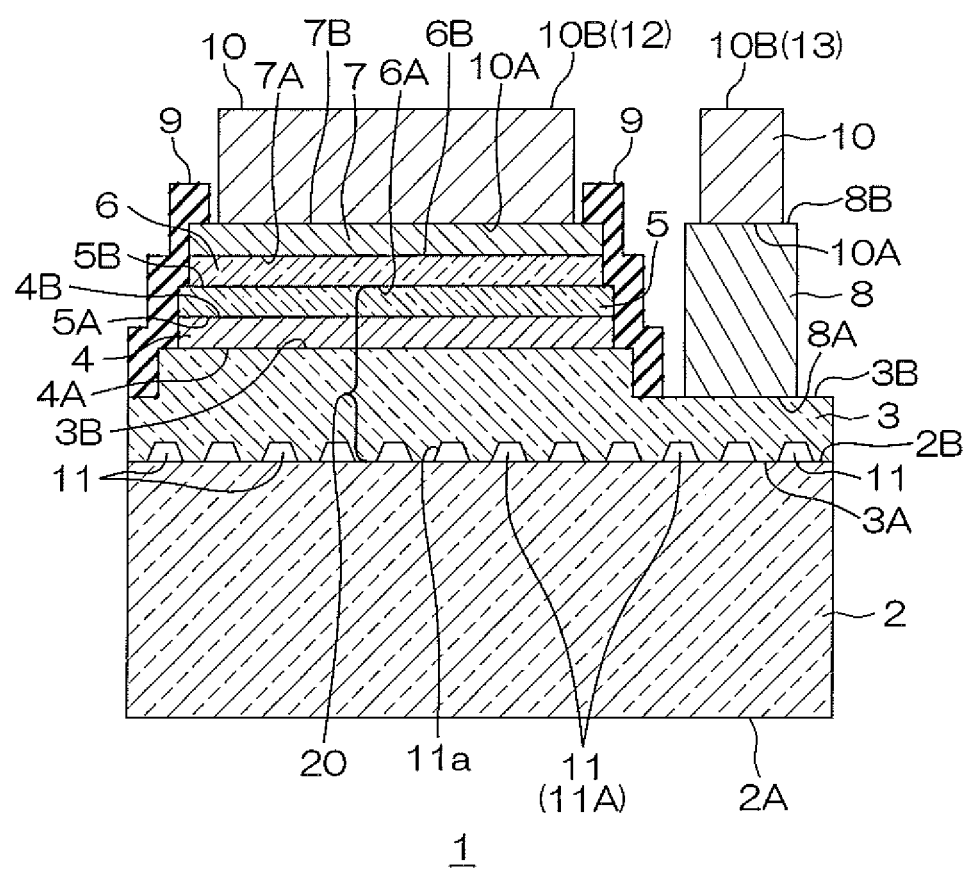
FIG. 1 shows a schematic sectional view of a semiconductor light emitting device according to a preferred embodiment of the present invention.

A semiconductor light emitting device according to a preferred embodiment of the present invention includes a substrate, a semiconductor layer which is formed on the substrate and includes a light emitting layer, and a diffraction/scattering film, which is formed between the light emitting layer and the substrate, for diffracting or scattering light generated at the light emitting layer, the diffraction/scattering film having a side surface slanted with respect to a film thickness direction thereof and having a composition gradient in the film thickness direction.

Light generated at the light emitting layer may be extracted from the device either from the substrate side or from the opposite side of the substrate. The diffraction/scattering film diffracts or scatters light generated at the light emitting layer, so as to reduce total reflection at an interface between the substrate and the semiconductor layer. This can improve the light extraction efficiency. More specifically, since the diffraction/scattering film has a side surface slanted with respect to the film thickness direction, the side surface can prompt diffraction/scattering of light. This contributes to improvement in the light extraction efficiency.

The diffraction/scattering film has a gradient composition which is gradient in a film thickness direction. Therefore, in formation of the diffraction/scattering film by etching, the etching rate varies at respective portions in a film thickness direction. Therefore, a side surface of the diffraction/scattering film becomes slanted in accordance with the gradient composition. Accordingly, by controlling the gradient composition in the film thickness direction of the diffraction/scattering film, it is possible to control the slant of a side surface of the diffraction/scattering film. The gradient composition in the film thickness direction of the diffraction/scattering film can be controlled with high accuracy and with high reproducibility. As a result, it becomes possible to control the slant of a side surface of the diffraction/scattering film with high accuracy and with high reproducibility. This provides a semiconductor light emitting device having an arrangement which can achieve excellent light extraction efficiency with high reproducibility.

In a preferred embodiment of the present invention, the semiconductor layer is a nitride semiconductor layer, and the diffraction/scattering film is a growth suppression film for suppressing growth of a nitride semiconductor in the process of growth of the nitride semiconductor layer on the substrate. With this arrangement, it is possible to form the diffraction/scattering film using the growth suppression film in the process of growth of the nitride semiconductor constituting the semiconductor layer. Since a growth suppression film is formed on the substrate, a crystal of a nitride semiconductor starts to grow from where a growth suppression film is not formed. As crystal growth proceeds, the nitride semiconductor layer grows laterally (in a direction parallel to the major surface of the substrate) so as to cover the top of the growth suppression film. This causes dislocation taken over from a defect of a substrate surface to the nitride semiconductor layer to extend laterally and be annihilated. As a result, a nitride semiconductor layer having low dislocation density of a surface layer portion can be obtained and excellent device characteristics can be realized. Accordingly, since a diffraction/scattering film can be formed using a process of forming a nitride semiconductor layer having high crystallinity, it is possible to provide a semiconductor light emitting device which can realize excellent light extraction efficiency with high reproducibility without requiring an additional process.

In a preferred embodiment of the present invention, the diffraction/scattering film includes silicon and nitrogen, and a composition of nitrogen has a gradient in the film thickness direction. Since a composition of nitrogen has a gradient in the film thickness direction, an etching rate in patterning of the diffraction/scattering film varies in the film thickness direction. This makes it possible to control the shape of a side surface of the diffraction/scattering film with high reproducibility and with high accuracy.

In a preferred embodiment of the present invention, the diffraction/scattering film includes silicon, nitrogen and oxygen, and a composition of nitrogen and a composition of oxygen have a gradient in the film thickness direction. Since the respective compositions of nitrogen and oxygen have a gradient in the film thickness direction, an etching rate in patterning of the diffraction/scattering film varies in the film thickness direction. This makes it possible to control the shape of a side surface of the diffraction/scattering film with high reproducibility and with high accuracy.

In a preferred embodiment of the present invention, the diffraction/scattering film includes a film portion having a composition varying from $SiO_2$ to SiON in the film thickness direction. $SiO_2$ and SiON have different etching rates from each other, and an etching rate of a film having an intermediate composition therebetween has an intermediate value between the etching rate of $SiO_2$ and the etching rate of SiON. Thus, a film portion having a composition varying from $SiO_2$ to SiON in the film thickness direction has an etching rate corresponding to composition variation and a side surface of the film portion has a shape corresponding to the composition variation.

In a preferred embodiment of the present invention, the diffraction/scattering film includes a film portion having a composition varying from $SiO_2$ to SiN in the film thickness direction. $SiO_2$ and SiN have different etching rates from each other, and an etching rate of a film having an intermediate composition therebetween has an intermediate value between the etching rate of $SiO_2$ and the etching rate of SiN. Thus, a film portion having a composition varying from $SiO_2$ to SiN in the film thickness direction has an etching rate corresponding to composition variation and a side surface of the film portion has a shape corresponding to the composition variation.

In a preferred embodiment of the present invention, the diffraction/scattering film includes a film portion having a composition varying from SiON to SiN in the film thickness direction. SiON and SiN have different etching rates from each other, and an etching rate of a film having an intermediate composition therebetween has an intermediate value between the etching rate of SiON and the etching rate of SiN. Thus, a film portion having a composition varying from SiON to SiN in the film thickness direction has an etching rate corresponding to composition variation and a side surface of the film portion has a shape corresponding to the composition variation.

In a preferred embodiment of the present invention, the diffraction/scattering film includes a film portion of $SiO_aN_b$ in which a composition a (a>0) of oxygen and a composition b (b>0) of nitrogen vary in the film thickness direction. The etching rate of $SiO_aN_b$ depends on the compositions a and b of oxygen and nitrogen. Thus, since etching for patterning of the diffraction/scattering film proceeds with an etching rate corresponding to the compositions a and b of respective portions of the film, a diffraction/scattering film having a side surface of a shape corresponding to variation of the compositions a and b can be obtained.

In a preferred embodiment of the present invention, the diffraction/scattering film includes a film portion of $SiN_x$ in which a nitrogen composition x varies in the film thickness direction. The etching rate of $SiN_x$ varies with the nitrogen composition x. Thus, since etching for patterning of the diffraction/scattering film proceeds with an etching rate corresponding to the nitrogen composition x of respective portions of the film, a diffraction/scattering film having a side surface of a shape corresponding to variation of the nitrogen composition x can be obtained.

In a preferred embodiment of the present invention, the diffraction/scattering film includes a film portion having a gradient nitrogen composition increasing monotonically from the substrate toward the light emitting layer.

In a preferred embodiment of the present invention, the diffraction/scattering film includes a film portion having a gradient oxygen composition decreasing monotonically from the substrate toward the light emitting layer.

In a preferred embodiment of the present invention, the diffraction/scattering film includes a film portion having an oxygen composition larger than a nitrogen composition.

In a preferred embodiment of the present invention, the diffraction/scattering film includes a film portion having a nitrogen composition larger than an oxygen composition.

In a preferred embodiment of the present invention, the diffraction/scattering film includes a film portion having a linear-gradient composition in the film thickness direction.

In a preferred embodiment of the present invention, the diffraction/scattering film includes a constant silicon composition in the film thickness direction.

The following description will explain preferred embodiments of the present invention in more detail with reference to the accompanying drawings.

FIG. 1 shows a schematic sectional view of a semiconductor light emitting device according to a preferred embodiment of the present invention.

The semiconductor light emitting device 1 is provided with a substrate 2, an n-type nitride semiconductor layer 3, a light emitting layer 4, a p-type nitride semiconductor layer 5, a transparent electrode layer 6, a reflecting electrode layer 7, an n-type electrode layer 8, a isolation insulation layer 9 and a junction layer 10. The n-type nitride semiconductor layer 3, the light emitting layer 4 and the p-type nitride semiconductor layer 5 compose a nitride semiconductor layer 20.

The n-type nitride semiconductor layer 3, the light emitting layer 4, the p-type nitride semiconductor layer 5, the transparent electrode layer 6, the reflecting electrode layer 7, the n-type electrode layer 8, the isolation insulation layer 9 and the junction layer 10 are formed on the substrate 2.

The substrate 2 is made of a material (e.g., sapphire, GaN or SiC) which is transparent to an emission wavelength X, (e.g., 450 nm) of the light emitting layer 4. The thickness of the substrate 2 is, for example, 400 μm. Regarding the substrate 2, a lower surface in FIG. 1 is a rear surface 2A and an upper surface in FIG. 1 is a surface 2B. The rear surface 2A is a light extraction surface from which light is extracted and forms a rear surface of the semiconductor light emitting device 1. The surface 2B is a surface of the substrate 2 to be joined with the n-type nitride semiconductor layer 3.

The n-type nitride semiconductor layer 3 is laminated on the substrate 2. The n-type nitride semiconductor layer 3 covers the entire area of the surface 2B of the substrate 2. The n-type nitride semiconductor layer 3 in this preferred embodiment is made of n-type GaN (an example of a nitride semiconductor) and is transparent to the emission wavelength λ of the light emitting layer 4. Regarding the n-type nitride semiconductor layer 3, a lower surface covering the surface 2B of the substrate 2 in FIG. 1 will be hereinafter referred to as a rear surface 3A, and an upper face at the opposite side of the rear surface 3A will be hereinafter referred to as a surface 3B. At the surface 3B, an area at the left side of FIG. 1 protrudes partially, which forms a step at the surface 3B.

The light emitting layer 4 is laminated on the n-type nitride semiconductor layer 3. The light emitting layer 4 partially covers the protruding area at a left portion of the surface 3B of the n-type nitride semiconductor layer 3 in FIG. 1. The light emitting layer 4 in this preferred embodiment is made of a nitride semiconductor (e.g., InGaN) including In. Regarding the light emitting layer 4, a lower surface covering an area at a left portion of the surface 3B of the n-type nitride semiconductor layer 3 in FIG. 1 will be hereinafter referred to as a rear surface 4A, and an upper surface at the opposite side of the rear surface 4A will be hereinafter referred to as a surface 4B.

The p-type nitride semiconductor layer 5 is laminated on the light emitting layer 4. The p-type nitride semiconductor layer 5 covers the entire area of the surface 4B of the light emitting layer 4. The laminate structure of the p-type nitride semiconductor layer 5 and the light emitting layer 4 are formed by patterning to obtain the same pattern collectively by a dry etching method. The p-type nitride semiconductor layer 5 is made of p-type GaN (an example of a nitride semiconductor) and is transparent to the emission wavelength λ of the light emitting layer 4. The total thickness of the n-type nitride semiconductor layer 3, the light emitting layer 4 and the p-type nitride semiconductor layer 5 is, for example, 6.5 μm at a maximum. Regarding the p-type nitride semiconductor layer 5, a lower surface covering the surface 4B of the light emitting layer 4 in FIG. 1 will be hereinafter referred to as a rear surface 5A, and an upper surface at the opposite side of the rear surface 5A will be hereinafter referred to as a surface 5B.

The transparent electrode layer 6 is laminated on the p-type nitride semiconductor layer 5. The transparent electrode layer 6 covers almost the entire area of the surface 5B of the p-type nitride semiconductor layer 5. The transparent electrode layer 6 is made of ZnO (zinc oxide) or ITO (tin-doped indium oxide) and is transparent to the emission wavelength λ of the light emitting layer 4. The transparent electrode layer 6 in this preferred embodiment is made of ITO. Regarding the transparent electrode layer 6, a lower surface covering the surface 5B of the p-type nitride semiconductor layer 5 in FIG. 1 will be hereinafter referred to as a rear surface 6A, and an upper surface at the opposite side of the rear surface 6A will be hereinafter referred to as a surface 6B.

The reflecting electrode layer 7 is laminated on the transparent electrode layer 6 to have the same pattern as that of the transparent electrode layer 6. The reflecting electrode layer 7 covers the entire area of the surface 6B of the transparent electrode layer 6 in FIG. 1 without protruding from the surface 6B. Regarding the reflecting electrode layer 7, a lower surface covering the surface 6B of the transparent electrode layer 6 in FIG. 1 will be hereinafter referred to as a rear surface 7A, and an upper surface at the opposite side of the rear surface 7A will be hereinafter referred to as a surface 7B. In the reflecting electrode layer 7, the rear surface 7A is a surface to face the surface 6B of the transparent electrode layer 6 and the entire area of the rear surface 7A is in contact (surface contact) with the surface 6B of the transparent electrode layer 6.

The reflecting electrode layer 7 in this preferred embodiment is made of an alloy including silver, a platinum group metal and copper. Platinum or palladium may be used as the platinum group metal. The compounding ratio of silver is approximately 98%, and the compounding ratio of a platinum group metal and that of copper are approximately 1% respectively. The thickness of the reflecting electrode layer 7 is, for example, 50 nm to 500 nm, and is preferably 350 nm.

The n-type electrode layer 8 is formed at an area at the right side of the surface 3B of the n-type nitride semiconductor layer 3 in FIG. 1. The n-type electrode layer 8 is formed at a portion of the surface 3B of the n-type nitride semiconductor layer 3 which is one step lower to the rear surface 3A side so as to form the step mentioned above. The n-type electrode layer 8 is made of Al or Cr. The n-type electrode layer 8 in this preferred embodiment is constructed by forming Al so as to come into contact with the n-type nitride semiconductor layer 3 and forming Cr on the Al. The thickness of the n-type electrode layer 8 is, for example, approximately 26000 Å. Regarding the n-type electrode layer 8, a surface to come into contact with the surface 3B of the n-type nitride semiconductor layer 3 in FIG. 1 will be hereinafter referred to as a rear surface 8A, and a surface at the opposite side of the rear surface 8A will be hereinafter referred to as a surface 8B.

The respective side surfaces of the n-type nitride semiconductor layer 3, the light emitting layer 4, the p-type nitride semiconductor layer 5, the transparent electrode layer 6 and the reflecting electrode layer 7 are covered with the isolation insulation layer 9 made of, for example, $SiO_2$. This separates and insulates the n-type electrode layer 8 from the light emitting layer 4, the p-type nitride semiconductor layer 5, the transparent electrode layer 6 and the reflecting electrode layer 7. As the material of the isolation insulation layer 9, SiN, AlN, Al$_2$O$_3$, SiON or the like may also be used instead of SiO$_2$. The thickness of the isolation insulation layer 9 is 500 Å to 50000 Å and is, for example, 1000 Å.

The junction layer 10 is laminated on the reflecting electrode layer 7 and the n-type electrode layer 8. The junction layer 10 is made of, for example, Ag, Ti or Pt, or an alloy thereof. The junction layer 10 may also be made of solder or AuSn. Furthermore, a diffusion preventing layer such as Pt may be inserted into the junction layer 10 in order to reduce diffusion from the junction layer 10 to the reflecting electrode layer 7 or the n-type electrode layer 8. The junction layer 10 in this preferred embodiment is constructed by laminating Ti, Pt and AuSn in this order from the side of the reflecting electrode layer 7 and the n-type electrode layer 8. Regarding the junction layer 10, a lower surface to come into contact with the reflecting electrode layer 7 or the n-type electrode layer 8 in FIG. 1 will be hereinafter referred to as a rear surface 10A, and an upper surface at the opposite side of the rear surface 10A will be hereinafter referred to as a surface 10B. The surface 10B forms a surface of the semiconductor light emitting device 1.

Regarding the junction layer 10, a surface 10B of a portion to come into contact with the reflecting electrode layer 7 will be hereinafter referred to as a p-type electrode portion 12, and a surface 10B at a portion to come into contact with the n-type electrode layer 8 will be hereinafter referred to as an n-type electrode portion 13. The p-type electrode portion 12 and the n-type electrode portion 13 respectively have flat surfaces and are flush with each other at the same height position. Since the isolation insulation layer 9 separates and insulates the reflecting electrode layer 7 from the n-type electrode layer 8 as described above, the p-type electrode portion 12 is electrically insulated from the n-type electrode portion 13.

When forward voltage is applied across the p-type electrode portion 12 and the n-type electrode portion 13, light having the emission wavelength λ of 440 nm to 460 nm is generated from the light emitting layer 4. The light passes through the n-type nitride semiconductor layer 3 and the substrate 2 in this order and is extracted from the rear surface 2A of the substrate 2. Light which travels from the light emitting layer 4 to the p-type nitride semiconductor layer 5 side passes through the p-type nitride semiconductor layer 5 and the transparent electrode layer 6 in this order and is reflected at an interface between the transparent electrode layer 6 and the reflecting electrode layer 7. Reflected light passes through the transparent electrode layer 6, the p-type nitride semiconductor layer 5, the light emitting layer 4, the n-type nitride semiconductor layer 3 and the substrate 2 in this order and is extracted from the rear surface 2A of the substrate 2.

At the surface 2B of the substrate 2, a diffraction/scattering film 11 is formed. The diffraction/scattering film 11 has a form of a plurality of protruding portions 11A protruding to the n-type nitride semiconductor layer 3 side.

Figure 2A:
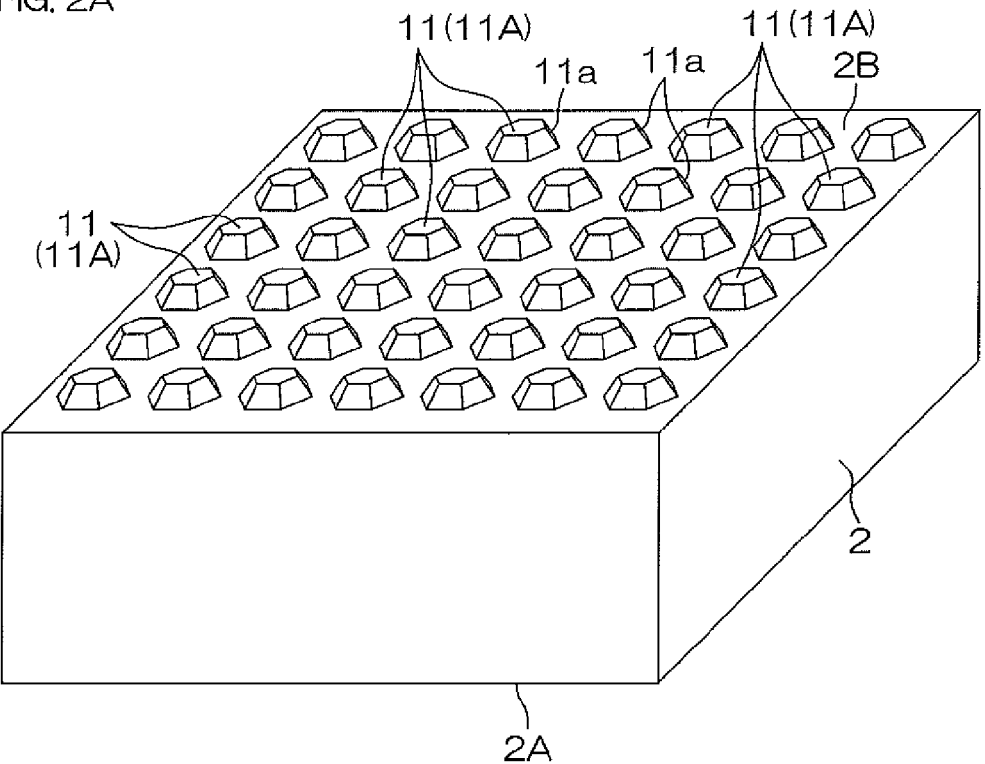
FIGS. 2A and 2B show graphical perspective views illustrating examples of an arrangement of a diffraction/scattering film provided in the semiconductor light emitting device.
Figure 2B:
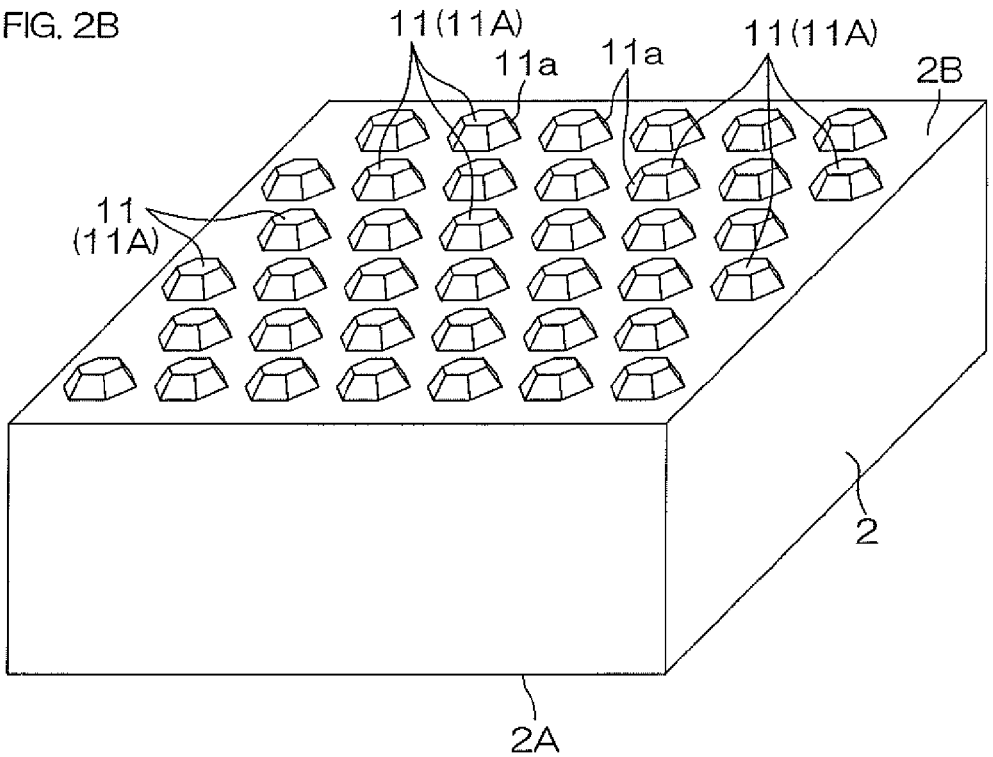

FIGS. 2A and 2B show graphical perspective views illustrating examples of an arrangement of the diffraction/scattering film 11.

The diffraction/scattering film 11 is formed by patterning to have a form of a plurality of protruding portions 11A which are arranged discretely at the surface 2B of the substrate 2. Specifically, a plurality of protruding portions 11A may be arranged in a matrix at intervals (see FIG. 2A), or may be arranged in zigzag alignment (see FIG. 2B). The diffraction/scattering film 11 is constituted of an insulating film including Si, O and N, and has a gradient composition in the film thickness direction. More specifically, a composition of at least one of oxygen and nitrogen has a gradient in the film thickness direction. Moreover, a protruding portion 11A has a side surface 11a slanted with respect to the film thickness direction (the normal direction of the major surface (rear surface 2A) of the substrate 2). FIGS. 2A and 2B show examples in which each protruding portion 11A is formed to have a hexagonal truncated pyramid shape.

Each protruding portion 11A is made of a material having a refractive index different from that of the n-type nitride semiconductor layer 3, and has a slanted side surface 11a. This makes it possible to reduce total reflection of light which travels from various directions toward the substrate 2 at the surface 2B of the substrate 2, and therefore more light passes through the substrate 2 to be extracted from the light extraction surface 2A to outside. That is, since it is possible to suppress reflection of light to the n-type nitride semiconductor layer 3 at the interface between the n-type nitride semiconductor layer 3 and the substrate 2, it is possible to improve the light extraction efficiency.

FIGS. 3A to 3J show schematic sectional views illustrating a method of manufacturing the semiconductor light emitting device illustrated in FIG. 1.

Figure 3A:
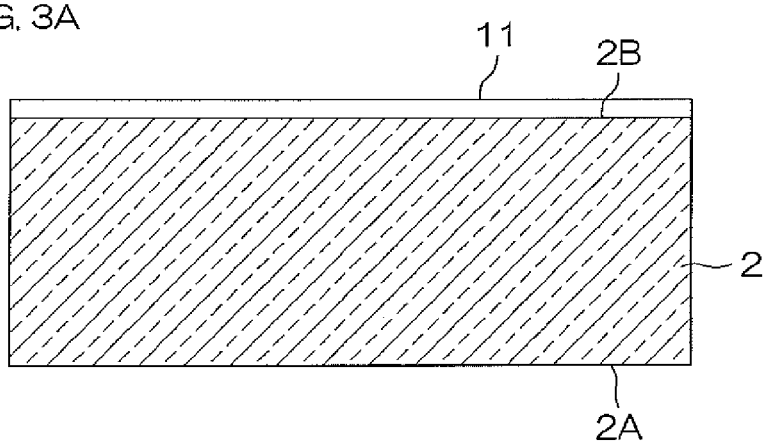
FIGS. 3A to 3J show schematic sectional views illustrating a method of manufacturing the semiconductor light emitting device illustrated in FIG. 1.

First, as illustrated in FIG. 3A, the diffraction/scattering film 11 is formed on the surface of the substrate 2. The diffraction/scattering film 11 may be formed by a plasma CVD (Chemical Vapor Deposition) method. By varying film formation conditions such as flow ratio of a source gas or radiofrequency power in formation of the diffraction/scattering film 11, it is possible to vary the composition of the diffraction/scattering film 11 in the film thickness direction.

Figure 3B:
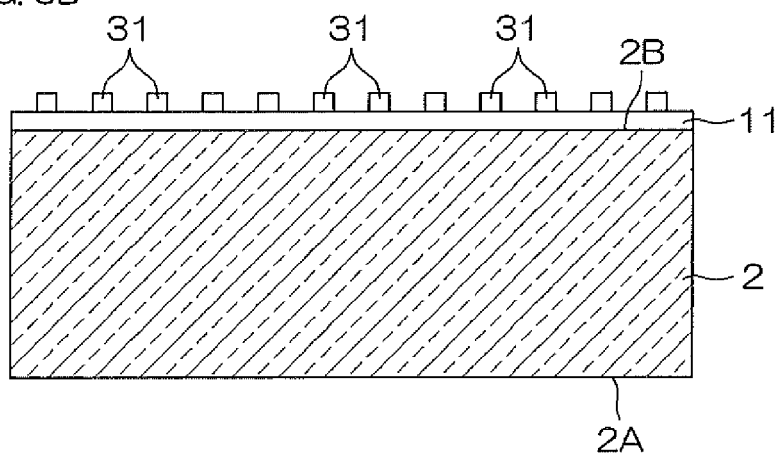
Figure 3C:
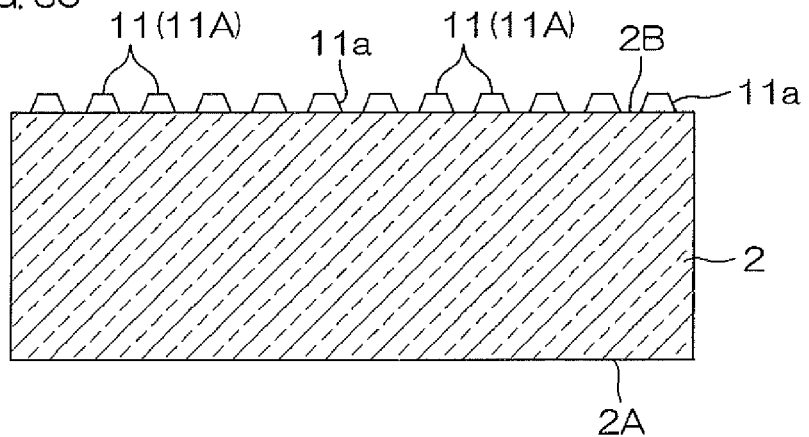
Figure 3D:
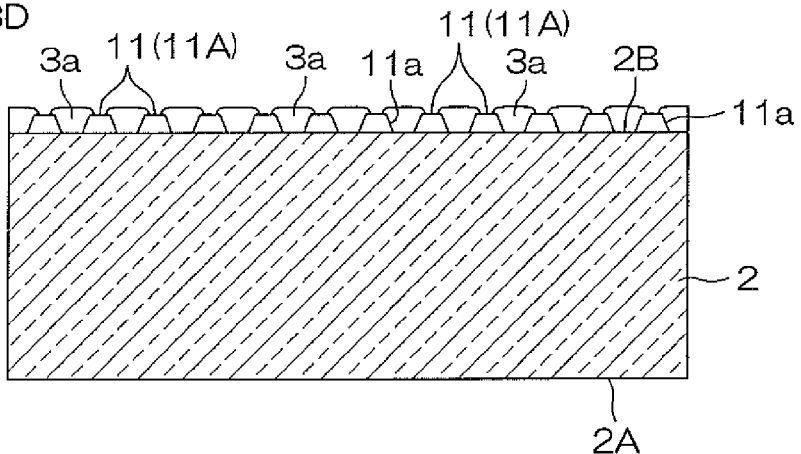
Figure 3E:
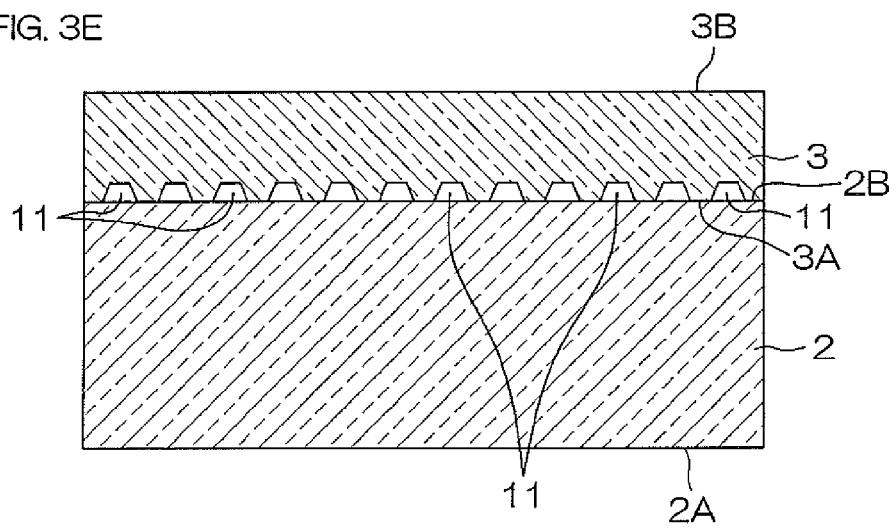

Next, as illustrated in FIG. 3B, the diffraction/scattering film 11 is etched using a resist pattern 31 as a mask, and is separated into a plurality of protruding portions 11A as illustrated in FIG. 3C. Etching may be achieved by plasma etching. The diffraction/scattering film 11 has a gradient composition in the film thickness direction, and the etching rate depends on the composition. Therefore, the etching rate fluctuates with progression of etching. Therefore, each protruding portion 11A has a side surface 11a having a shape corresponding to fluctuation of the etching rate. That is, the shape of the side surface 11a corresponds to the gradient composition in the film thickness direction of the diffraction/scattering film 11.

Next, the resist pattern 31 is removed and necessary cleaning is performed, and then a layer (n-GaN layer) made of n-type GaN is formed by epitaxial growth on the surface 2B of the substrate 2. More specifically, a GaN crystal is formed by epitaxial growth while introducing n-type impurities (e.g., Si), by selective lateral growth set at growth conditions by which crystal growth proceeds along the major surface of the substrate 2. Here, the diffraction/scattering film 11 functions as a growth suppression film that suppresses growth of a GaN crystal. Therefore, crystal growth starts at the surface 2B of the substrate 2 exposed from the diffraction/scattering film 11, and a grown GaN crystal 3a spreads in the lateral direction parallel to the surface 2B of the substrate 2 (see FIG. 3D) and finally covers the whole of the diffraction/scattering film 11. By such lateral growth, it is possible to annihilate dislocation which is taken over from a crystal defect of the substrate 2 and generated in a GaN crystal 3. Epitaxial growth of the GaN crystal 3a is further continued until a predetermined thickness is obtained. This can form an n-type nitride semiconductor layer 3 having a surface layer portion having less dislocation (see FIG. 3E).

Figure 3F:
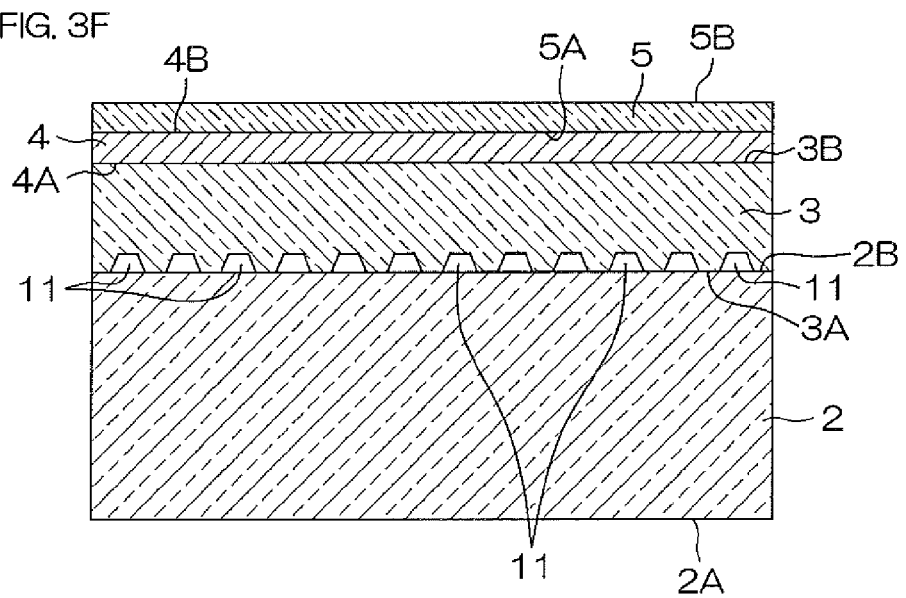

Next, as illustrated in FIG. 3F, a nitride semiconductor layer (e.g., In$_z$Ga$_{1-z}$N layer, wherein 0<z<1) including In is formed by epitaxial growth on the surface 3B of the n-type nitride semiconductor layer 3. This layer becomes the light emitting layer 4 laminated on the n-type nitride semiconductor layer 3. The emission wavelength λ of the light emitting layer 4 is controlled to 440 nm to 460 nm by adjusting the compositions of In and Ga.

Next, as illustrated in FIG. 3F, a GaN layer (p-GaN layer) is formed by epitaxial growth on the surface 4B of the light emitting layer 4 as the p-type nitride semiconductor layer 5 while introducing p-type impurities (e.g., Mg) similarly. The p-type nitride semiconductor layer 5 may be constituted of a p-AlGaN layer including Al in the composition or may be constituted of a laminate structure including a p-GaN layer and a p-AlGaN layer.

Figure 3G:
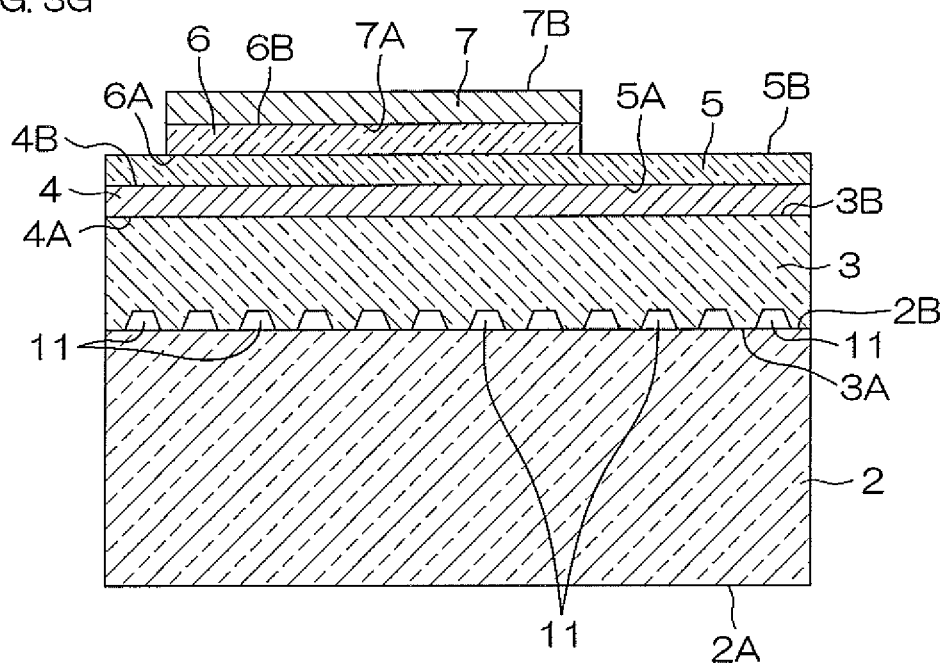

Next, a resist pattern (not illustrated) having an opening at an area where the transparent electrode layer 6 is to be formed is formed on the p-type nitride semiconductor layer 5. Then, an ITO material is deposited on the p-type nitride semiconductor layer 5 by, for example, a sputtering method over the resist pattern. Then, an unnecessary portion of the ITO material is lifted off together with the resist pattern. This selectively forms, for example, a layer (ITO layer) made of ITO on the surface 5B of the p-type nitride semiconductor layer 5 as illustrated in FIG. 3G. This ITO layer becomes the transparent electrode layer 6. In the process of formation of the transparent electrode layer 6, heat treatment may be performed in order to obtain high electrical junction property and adhesion property of the transparent electrode layer 6 with the p-type nitride semiconductor layer 5, and heat treatment in such a case may be performed at a temperature of 500 to 700° C.

Next, a layer (alloy layer) of an alloy including silver, a platinum group metal and copper is formed over the entire surface of the surface 6B of the transparent electrode layer 6 and the surface 5B of the p-type nitride semiconductor layer 5. By etching the alloy layer using a resist pattern (not illustrated) as a mask, the reflecting electrode layer 7 having the same pattern as that of the transparent electrode layer 6 is formed on the transparent electrode layer 6 as illustrated in FIG. 3G.

Figure 3H:
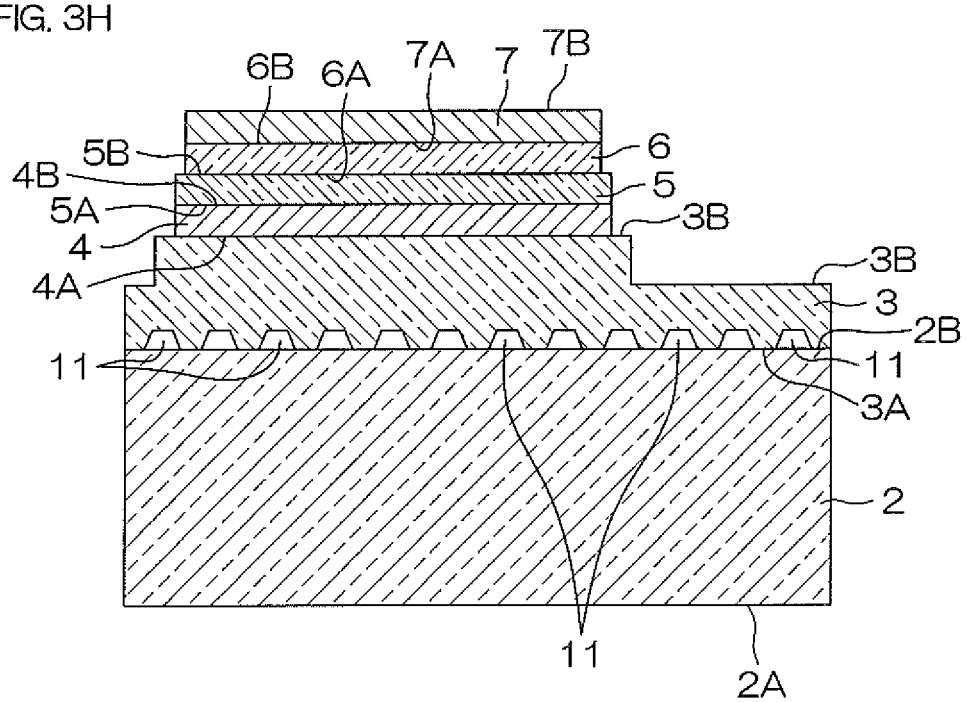
Figure 3:
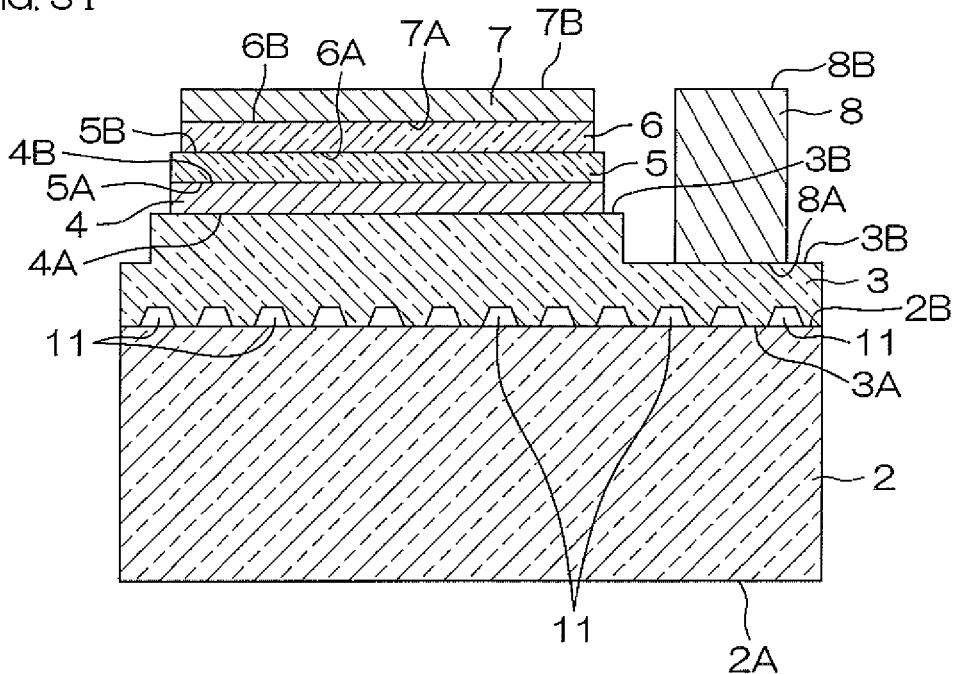
Figure 3:
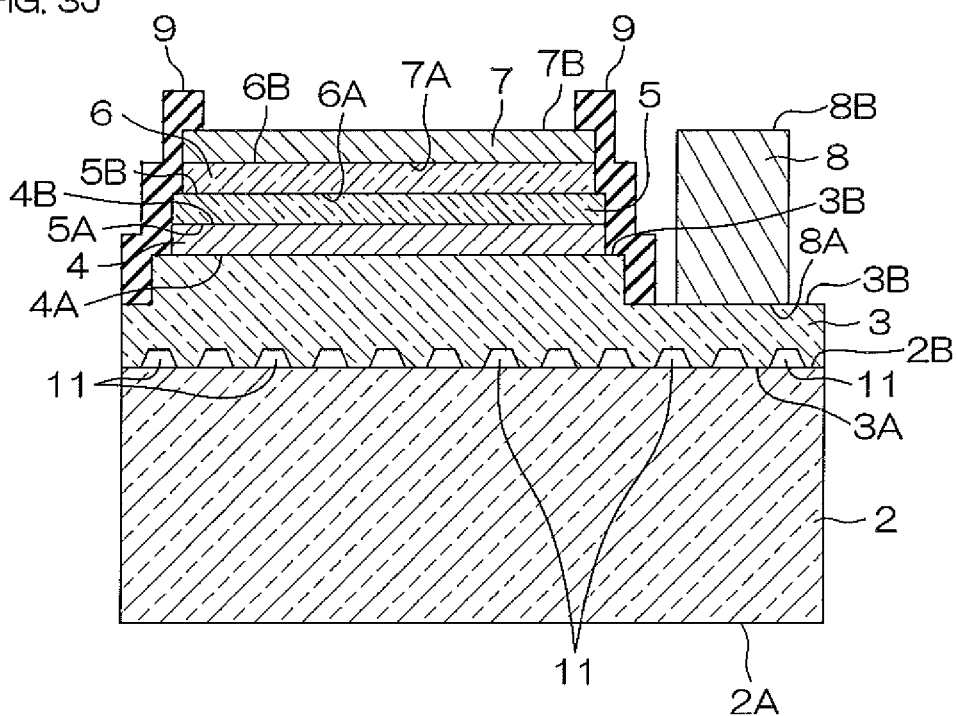

Next, by etching using a resist pattern (not illustrated) as a mask, the p-type nitride semiconductor layer 5, the light emitting layer 4 and the n-type nitride semiconductor layer 3 are respectively removed selectively as illustrated in FIG. 3H.

Next, as illustrated in FIG. 3I, the n-type electrode layer 8 is formed on the surface 3B of the n-type nitride semiconductor layer 3 by, for example, a lift off method. As the n-type electrode layer 8, Al, a laminate structure including Ti and Al or the like can be used. In the process of formation of the n-type electrode layer 8, heat treatment may be performed in order to improve the adhesion property or the electrical junction property of the n-type electrode layer 8 with the n-type nitride semiconductor layer 3.

Next, as illustrated in FIG. 3J, the isolation insulation layer 9 made of $SiO_2$ is formed. The isolation insulation layer 9 is formed so as to cover a portion of an area of the surface 3B of the n-type nitride semiconductor layer 3 near to the p-type electrode portion 12 (see FIG. 1), side surfaces of the light emitting layer 4, the p-type nitride semiconductor layer 5, the transparent electrode layer 6 and the reflecting electrode layer 7, and a portion of the surface 7B of the reflecting electrode layer 7. The isolation insulation layer 9 may be formed by a lift off method or an etch off method. As the isolation insulation layer 9, SiN, AlN, $Al_2O_3$, SiON or the like can be used instead of $SiO_2$.

Next, the junction layer 10 is formed on the surface 7B of the reflecting electrode layer 7 and on the surface 8B of the n-type electrode layer 8 by a lift off method. In this preferred embodiment, a layer (AuSn layer) made of AuSn is used as the junction layer 10. In order to protect the reflecting electrode layer 7 and the n-type electrode layer 8 from diffusion of the AuSn layer, a diffusion preventing layer made of Pt may be inserted into the junction layer 10. In order to improve the adhesion property of the junction layer 10 with the reflecting electrode layer 7 and the n-type electrode layer 8, the junction layer 10 may have a Ti layer at an interface between the junction layer 10 and the reflecting electrode layer 7 and the n-type electrode layer 8. That is, the junction layer 10 may be constituted of a laminated metal layer in which a Ti layer, a Pt layer and an AuSn layer are laminated in this order from the reflecting electrode layer 7 and the n-type electrode layer 8 side.

Processes up to here are performed in a state of a semiconductor wafer having a plurality of device areas. After these processes, by adjusting the thickness of a wafer to, for example, 300 μm by a grinding/polishing process if desired and then processing the device from a wafer state to a chip state by a device separating process (scribe/break), the semiconductor light emitting device 1 in FIG. 1 is finally obtained individually.

Figure 4:
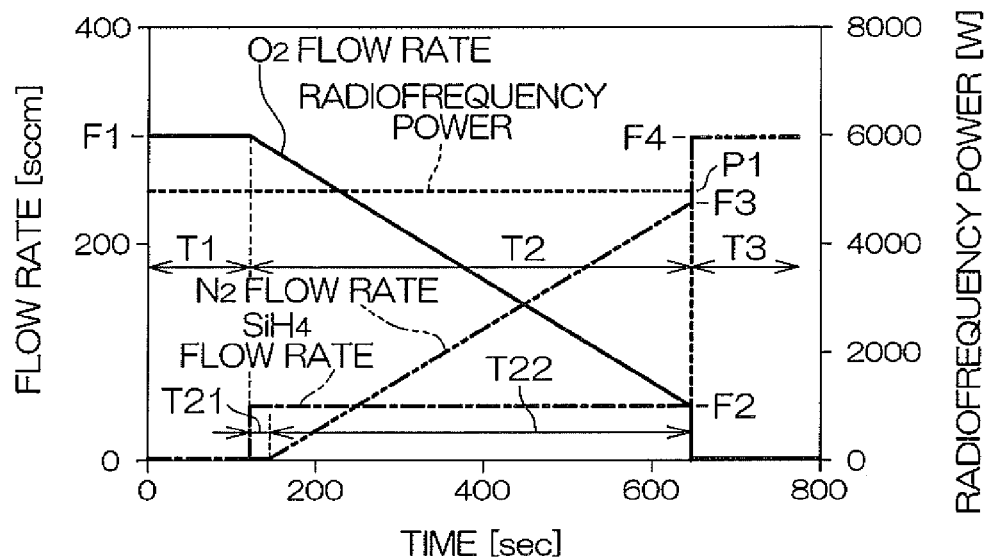
FIG. 4 shows a view for explaining a first example of a process of forming a diffraction/scattering film.

FIG. 4 shows a view for explaining a first example of a process of forming the diffraction/scattering film 11. Specifically, source gas flow rate variation with time and radiofrequency power variation with time in formation of the diffraction/scattering film 11 by a plasma CVD method are illustrated. A time period T1 is a preheating time period for heating a wafer by plasma. A time period T2 is a film formation time period. A time period T3 is a cooling time period for cooling the inside of a treatment chamber.

During the preheating time period T1, the flow rate of $O_2$ is held at an initial flow rate F1 larger than zero and the radiofrequency power is also held at a constant value P1 larger than zero. Both of the $N_2$ flow rate and the $SiH_4$ flow rate are zero. Accordingly, a film is not deposited on the wafer.

During the film formation time period T2, the $O_2$ flow rate decreases monotonically (linearly in the example in FIG. 4) from the initial flow rate F1 and becomes a predetermined value F2 (<F1) larger than zero at the end of the film formation time period T2. On the other hand, the $N_2$ flow rate is held at zero in an initial predetermined time period T21 of the film formation time period T2, and increases monotonically (linearly in the example in FIG. 4) from zero to a predetermined value F3 (>F2) in a time period T22 which follows the time period T21. The $SiH_4$ flow rate is held at a constant value larger than zero throughout the film formation time period T2. The radiofrequency power is held at the constant value P1 larger than zero throughout the film formation time period T2.

Thus, an $SiO_2$ film is formed in the time period T21 and an $SiO_aN_b$ film is deposited on the $SiO_2$ film (here, a>0 and b>0) in the time period T22. Since the O composition a and the N composition b of the $SiO_aN_b$ film respectively depend on the $O_2$ flow rate and the $N_2$ flow rate, the O composition a in the $SiO_aN_b$ film decreases monotonically (linearly in this preferred embodiment) and the N composition b increases monotonically (linearly in this preferred embodiment) as film formation proceeds. The $O_2$ flow rate and the $N_2$ flow rate become equal once in the process of film formation, and then the magnitude relationship inverts. Thus, the O composition a and the N composition b in the $SiO_aN_b$ film become equal at some position halfway through film thickness, and the magnitude relationship inverts across the equal composition position. The Si composition is constant in the film thickness direction.

In such a manner, the diffraction/scattering film 11 has an $SiO_2$ film portion and an $SiO_aN_b$ film portion, and the O composition a and the N composition b in the $SiO_aN_b$ film portion have a gradient in the film thickness direction. More specifically, the O composition a of the $SiO_aN_b$ film portion decreases monotonically from the substrate 2 toward the light emitting layer 4. On the other hand, the N composition b of the $SiO_aN_b$ film portion increases monotonically from the substrate 2 toward the light emitting layer 4. The $SiO_aN_b$ film portion has a position where the O composition a and the N composition b are equal at some position halfway in the film thickness direction, and the O composition a is larger than the N composition b at the substrate 2 side with respect to the equal composition position and the N composition b is larger than the O composition a at the light emitting layer 4 side with respect to the equal composition position.

During the cooling time period T3, both of the $O_2$ flow rate and the $SiH_4$ flow rate are set at zero while the $N_2$ flow rate is set at a predetermined flow rate F4 (>F3) and the radiofrequency power is set at zero. This allows $N_2$ to be sent into the treatment chamber at a high flow rate so as to cool the inside of the treatment chamber.

Figure 5:
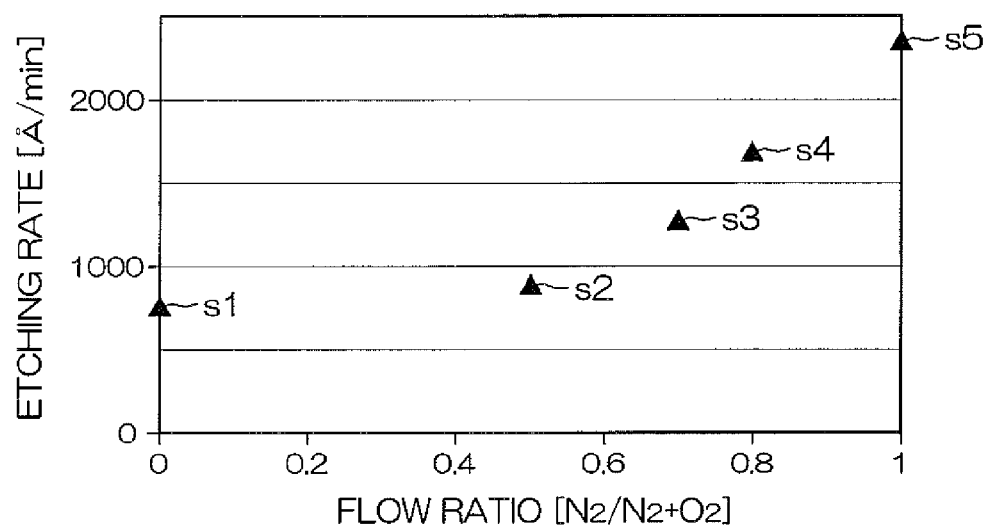
FIG. 5 shows a view for explaining an etching rate of $SiO_xN_y$ ($x \geq 0$ and $y \geq 0$).

FIG. 5 shows a view for explaining an etching rate of $SiO_xN_y$ (x≥0 and y≥0). The flow ratio in film formation of an $SiO_xN_y$ film is represented on the horizontal axis, and the etching rate of plasma etching is represented on the vertical axis. A flow ratio is defined as $N_2$ flow rate/($N_2$ flow rate+$O_2$ flow rate). As etching gas for plasma etching, $CH_4$ was used. As the flow ratio increases, the O composition x decreases and the N composition y increases. A sample s1 corresponds to a case where the $N_2$ flow rate is zero, which indicates an etching rate for $SiO_2$. A sample s5 corresponds to a case where the $O_2$ flow rate is zero, which indicates an etching rate for SiN ($Si_3N_4$). The sample s5 has an etching rate larger than that of the sample s1 and the samples s2 to s4 indicate intermediate etching rates between the sample s1 and the sample s5, which shows that the etching rate increases as the N composition increases.

As described above, in accordance with this preferred embodiment, the diffraction/scattering film 11 has a gradient composition in the film thickness direction. Therefore, when patterning by etching is performed on the diffraction/scattering film 11 so as to form the plurality of protruding portions 11A, the etching rate at respective portions in the film thickness direction varies. Therefore, the side surface 11a of each protruding portion 11A becomes slanted depending on the gradient composition. Accordingly, by controlling the gradient composition in the film thickness direction of the diffraction/scattering film 11, it is possible to control the slant of a side surface 11a of each protruding portion 11A. The gradient composition in the film thickness direction of the diffraction/scattering film 11 can be controlled with high accuracy and with high reproducibility by controlling film formation conditions. As a result, it becomes possible to control the slant of a side surface 11a of each protruding portion 11A with high accuracy and with high reproducibility. This can provide a semiconductor light emitting device 1 having an arrangement which can achieve excellent light extraction efficiency with high reproducibility.

In this preferred embodiment, the diffraction/scattering film 11 also serves as a growth suppression film that suppresses growth of a nitride semiconductor in the process of growth of the nitride semiconductor layer 20 on the substrate 2. Therefore, since the diffraction/scattering film 11 can be formed using a process of forming the nitride semiconductor layer 20 having high crystallinity, it is possible to provide a semiconductor light emitting device 1 which can realize excellent light extraction efficiency with high reproducibility without requiring an additional process.

Figure 6:
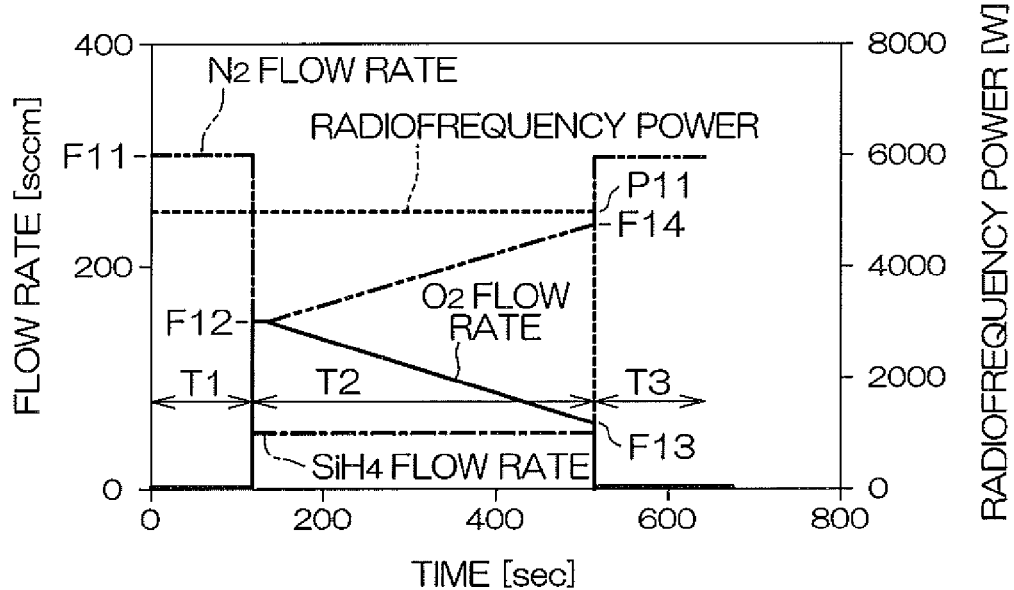
FIG. 6 shows a view for explaining a second preferred embodiment of the present invention and for explaining a second example of a process of forming a diffraction/scattering film.

FIG. 6 shows a view for explaining a second preferred embodiment of the present invention and for explaining a second example 2 of a process of forming the diffraction/scattering film 11. Specifically, source gas flow rate variation with time and radiofrequency power variation with time in formation of the diffraction/scattering film 11 by a plasma CVD method are illustrated as in FIG. 4. A time period T1 is a preheating time period for heating a wafer by plasma. A time period T2 is a film formation time period. A time period T3 is a cooling time period for cooling the inside of a treatment chamber.

During the preheating time period T1, the flow rate of $O_2$ is held at zero and the radiofrequency power is held at a constant value P11 larger than zero. The $N_2$ flow rate is held at a constant value F11 larger than zero and the $SiH_4$ flow rate is held at zero. Accordingly, a film is not deposited on the wafer.

During the film formation time period T2, the $O_2$ flow rate decreases monotonically (linearly in the example in FIG. 6) from an initial flow rate F12 larger than zero and becomes a predetermined value F13 (<F12) smaller than the initial flow rate F12 and larger than zero at the end of the film formation time period T2. On the other hand, the $N_2$ flow rate increases monotonically (linearly in the example in FIG. 6) from the initial flow rate F12 and becomes a predetermined value F14 (>F12) larger than the initial flow rate F12 at the end of the film formation time period T2. The $SiH_4$ flow rate is held at a constant value larger than zero throughout the film formation time period T2. The radiofrequency power is held at the constant value P11 larger than zero throughout the film formation time period T2.

Thus, an $SiO_aN_b$ film is deposited (here, a>0 and b>0) during the time period T2. Since the O composition a and the N composition b of the $SiO_aN_b$ film respectively depend on the $O_2$ flow rate and the $N_2$ flow rate, an initial O composition a is equal to an initial N composition b, and the O composition a in the $SiO_aN_b$ film decreases monotonically (linearly in this preferred embodiment) and the N composition b increases monotonically (linearly in this preferred embodiment) as film formation proceeds. Since the initial flow rates F12 of $O_2$ and $N_2$ are equal to each other, a≤b is satisfied at any position in the film thickness direction. The Si composition is constant at any position in the film thickness direction.

Figure 12:
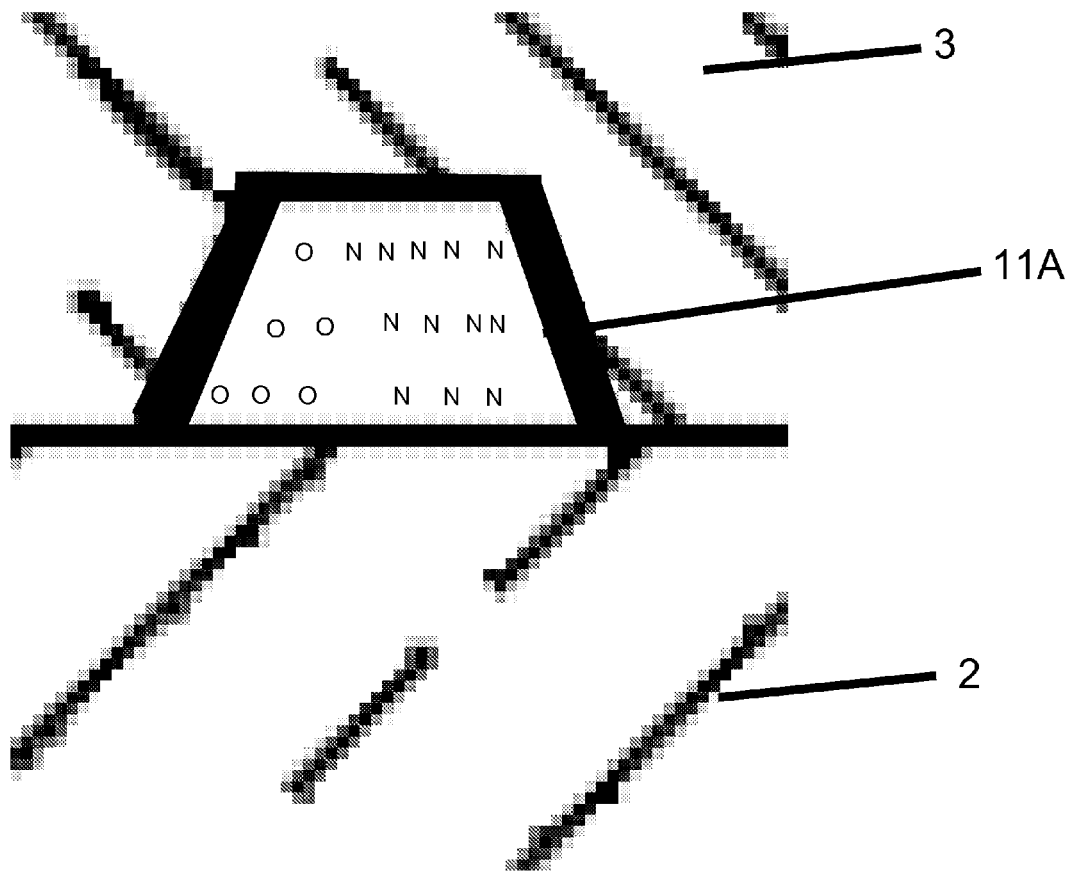
FIG. 12 illustrates a gradient of the diffraction/scattering film 11.

In such a manner, the diffraction/scattering film 11 is constituted of an $SiO_aN_b$ film, and the O composition a and the N composition b have a gradient in the film thickness direction. More specifically, the O composition of the $SiO_aN_b$ film portion decreases monotonically from the substrate 2 toward the light emitting layer 4. On the other hand, the N composition of the $SiO_aN_b$ film increases monotonically from the substrate 2 toward the light emitting layer 4. The N composition b is equal to or larger than the O composition a at any portion of the $SiO_aN_b$ film. This is illustrated in FIG. 12 for instance. In FIG. 12, one of the protruding portions 11A of the diffraction/scattering film 11 in FIG. 1 is illustrated, and has the O and N compositions represented by the letters "O" and "N" respectively. For clarity, several of the layers illustrated in FIG. 1 have been omitted, and only one of the protruding portions 11A of the diffraction/scattering film 11 is illustrated. However, the gradient may apply to each of the protruding portions 11A of FIG. 1 or the other embodiments described herein. The light emitting layer 4 is in the direction of the arrow. The O composition decreases monotonically from the substrate 2 toward the light emitting layer 4; and the N composition increases monotonically from the substrate 2 toward the light emitting layer 4. While a specific amount of O and N compositions are illustrated, a person of ordinary skill in the art would understand that these compositions may vary while still maintaining the above requirements. Since the O composition a and the N composition b have a gradient in the film thickness direction, the diffraction/scattering film 11 has an etching rate varying in the film thickness direction, and a protruding portion 11A (see FIGS. 2A and 2B and the like) having a side surface 11a slanted depending on the gradient composition is formed.

During the cooling time period T3, both of the $O_2$ flow rate and the $SiH_4$ flow rate are set at zero while the $N_2$ flow rate is set at a predetermined flow rate F15 (>F14) and the radiofrequency power is set at zero. This allows $N_2$ to be sent into the treatment chamber at a high flow rate so as to cool the inside of the treatment chamber.

Figure 7:
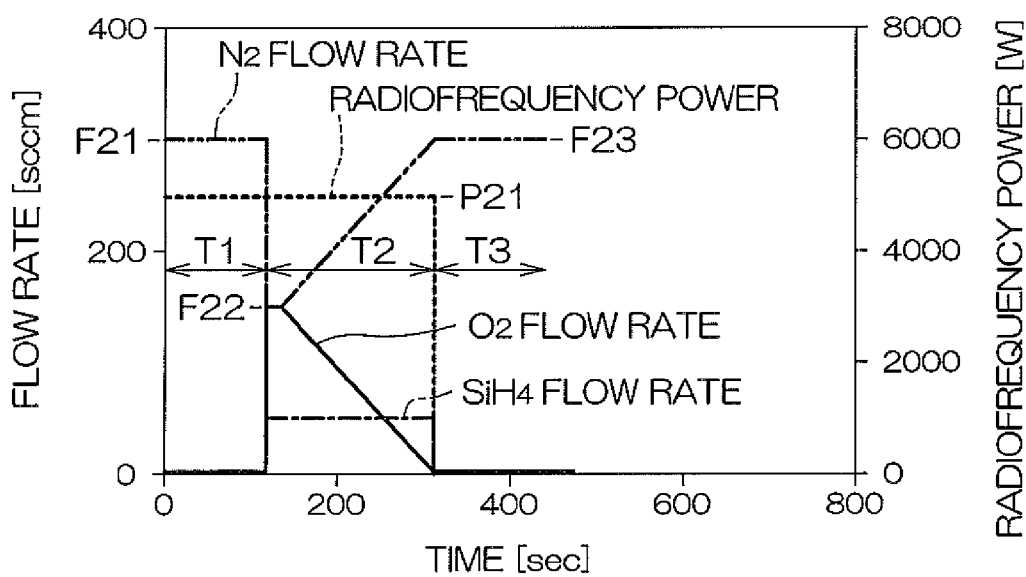
FIG. 7 shows a view for explaining a third preferred embodiment of the present invention and for explaining a third example of a process of forming a diffraction/scattering film.

FIG. 7 shows a view for explaining a third preferred embodiment of the present invention and for explaining a third example of a process of forming the diffraction/scattering film 11. Specifically, source gas flow rate variation with time and radiofrequency power variation with time in formation of the diffraction/scattering film 11 by a plasma CVD method are illustrated as in FIG. 4. A time period T1 is a preheating time period for heating a wafer by plasma. A time period T2 is a film formation time period. A time period T3 is a cooling time period for cooling the inside of a treatment chamber.

During the preheating time period T1, the flow rate of $O_2$ is held at zero and the radiofrequency power is held at a constant value P21 larger than zero. The $N_2$ flow rate is held at a constant value F21 larger than zero and the $SiH_4$ flow rate is held at zero. Accordingly, a film is not deposited on the wafer.

During the film formation time period T2, the $O_2$ flow rate decreases monotonically (linearly in the example in FIG. 7) from an initial flow rate F22 larger than zero and becomes zero at the end of the film formation time period T2. On the other hand, the $N_2$ flow rate increases monotonically (linearly in the example in FIG. 7) from the initial flow rate F22 and becomes a predetermined value F23 (>F22) larger than the initial flow rate F22 at the end of the film formation time period T2. The $SiH_4$ flow rate is held at a constant value larger than zero throughout the film formation time period T2. The radiofrequency power is held at the constant value P21 larger than zero throughout the film formation time period T2.

Thus, an $SiO_aN_b$ film is deposited (here, a≥0 and b>0) during the time period T2, and the O composition a becomes zero at the end of the film formation time period T2, so that SiN is obtained. Since the O composition a and the N composition b of the $SiO_aN_b$ film respectively depend on the $O_2$ flow rate and the $N_2$ flow rate, an initial O composition a is equal to an initial N composition b, and the O composition a in the $SiO_aN_b$ film decreases monotonically (linearly in this preferred embodiment) and the N composition b increases monotonically (linearly in this preferred embodiment) as film formation proceeds. Since the initial flow rates F22 of $O_2$ and $N_2$ are equal to each other, a≤b is satisfied at any position in the film thickness direction. The Si composition is constant at any position in the film thickness direction.

In such a manner, the diffraction/scattering film 11 is constituted of an $SiO_aN_b$ film, and the O composition a and the N composition b have a gradient in the film thickness direction. More specifically, the O composition of the $SiO_aN_b$ film portion decreases monotonically from the substrate 2 toward the light emitting layer 4 and becomes zero at an interface between the diffraction/scattering film 11 and the light emitting layer 4. On the other hand, the N composition of the $SiO_aN_b$ film increases monotonically from the substrate 2 toward the light emitting layer 4. The N composition b is equal to or larger than the O composition a at any portion of the $SiO_aN_b$ film, and SiN is obtained at an interface between the diffraction/scattering film 11 and the light emitting layer 4.

During the cooling time period T3, the $O_2$ flow rate and the $SiH_4$ flow rate are set at zero while the $N_2$ flow rate is set at a predetermined flow rate F23 and the radiofrequency power is set at zero. This allows $N_2$ to be sent into the treatment chamber at a high flow rate so as to cool the inside of the treatment chamber.

Figure 8:
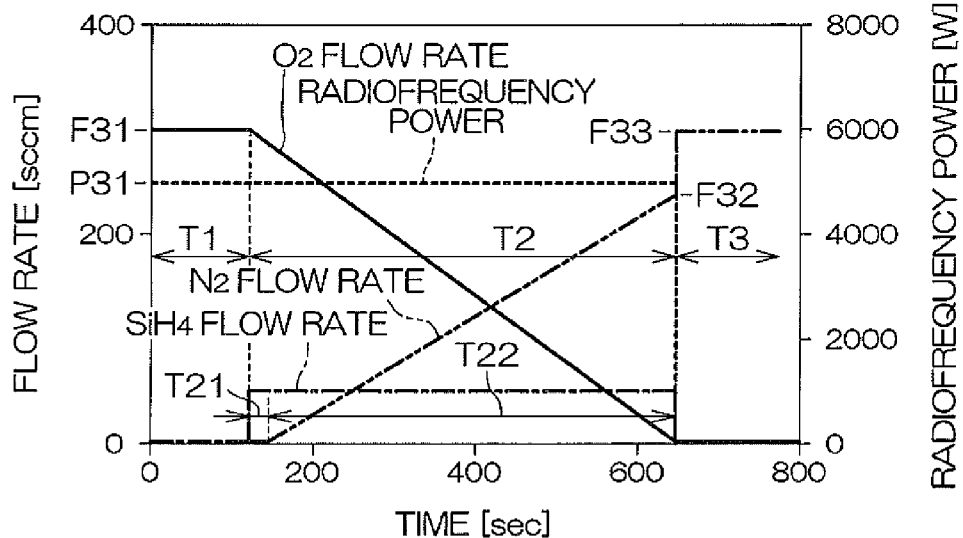
FIG. 8 shows a view for explaining a fourth preferred embodiment of the present invention and for explaining a fourth example of a process of forming a diffraction/scattering film.

FIG. 8 shows a view for explaining a fourth preferred embodiment of the present invention and for explaining a fourth example of a process of forming the diffraction/scattering film 11. Specifically, source gas flow rate variation with time and radiofrequency power variation with time in formation of the diffraction/scattering film 11 by a plasma CVD method are illustrated as in FIG. 4. A time period T1 is a preheating time period for heating a wafer by plasma. A time period T2 is a film formation time period. A time period T3 is a cooling time period for cooling the inside of a treatment chamber.

During the preheating time period T1, the flow rate of $O_2$ is held at an initial flow rate F31 larger than zero and the radiofrequency power is also held at a constant value P31 larger than zero. Both of the $N_2$ flow rate and the $SiH_4$ flow rate are zero. Accordingly, a film is not deposited on the wafer.

During the film formation time period T2, the $O_2$ flow rate decreases monotonically (linearly in the example in FIG. 8) from the initial flow rate F31 and becomes zero at the end of the film formation time period T2. On the other hand, the $N_2$ flow rate is held at zero during an initial predetermined time period T21 of the film formation time period T2 and increases monotonically (linearly in the example in FIG. 8) from zero to a predetermined value F32 (>0) during a time period T22 which follows the time period T21. The $SiH_4$ flow rate is held at a constant value larger than zero throughout the film formation time period T2. The radiofrequency power is held at a constant value P31 larger than zero throughout the film formation time period T2.

Thus, an $SiO_2$ film is formed during the time period T21 and an $SiO_aN_b$ film is deposited (here, a≥0 and b>0) on the $SiO_2$ film during the time period T21, and the O composition a becomes zero at the end of the film formation time period T2, so that SiN is obtained. Since the O composition a and the N composition b of the $SiO_aN_b$ film respectively depend on the $O_2$ flow rate and the $N_2$ flow rate, the O composition a in the $SiO_aN_b$ film decreases monotonically (linearly in this preferred embodiment) and the N composition b increases monotonically (linearly in this preferred embodiment) as film formation proceeds. The $O_2$ flow rate and the $N_2$ flow rate become equal once in the process of film formation, and then the magnitude relationship inverts.

Thus, the O composition a and the N composition b in the $SiO_aN_b$ film become equal at some position halfway through film thickness, and the magnitude relationship inverts across the equal composition position. In such a manner, the diffraction/scattering film 11 has an $SiO_2$ film portion and an $SiO_aN_b$ film portion, and the O composition a and the N composition b in the $SiO_aN_b$ film portion have a gradient in the film thickness direction. More specifically, the O composition of the $SiO_aN_b$ film portion decreases monotonically from the substrate 2 toward the light emitting layer 4 and becomes zero at the interface between the diffraction/scattering film 11 and the light emitting layer 4. On the other hand, the N composition of the $SiO_aN_b$ film portion increases monotonically from the substrate 2 toward the light emitting layer 4. The $SiO_aN_b$ film portion has a position where the O composition and the N composition are equal at some position halfway in the film thickness direction, and the O composition a is larger than the N composition b at the substrate 2 side with respect to the equal composition position and the N composition b is larger than the O composition a at the light emitting layer 4 side with respect to the equal composition position. At the interface between the diffraction/scattering film 11 and the light emitting layer 4 where the O composition a becomes zero, the $SiO_aN_b$ film portion becomes SiN. The Si composition is constant at any position in the film thickness direction of the diffraction/scattering film 11.

During the cooling time period T3, both of the $O_2$ flow rate and the $SiH_4$ flow rate are set at zero while the $N_2$ flow rate is set at a predetermined flow rate F33 (>F32) and the radiofrequency power is set at zero. This allows $N_2$ to be sent into the treatment chamber at a high flow rate so as to cool the inside of the treatment chamber.

Figure 9:
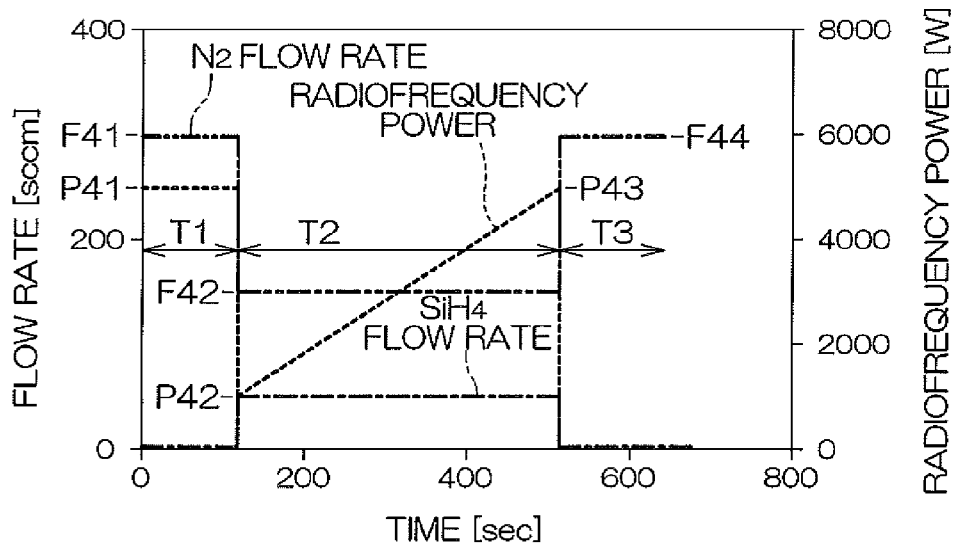
FIG. 9 shows a view for explaining a fifth preferred embodiment of the present invention and for explaining a fifth example of a process of forming a diffraction/scattering film.

FIG. 9 shows a view for explaining a fifth preferred embodiment of the present invention and for explaining a fifth example of a process of forming the diffraction/scattering film 11. Specifically, source gas flow rate variation with time and radiofrequency power variation with time in formation of the diffraction/scattering film 11 by a plasma CVD method are illustrated as in FIG. 4. A time period T1 is a preheating time period for heating a wafer by plasma. A time period T2 is a film formation time period. A time period T3 is a cooling time period for cooling the inside of a treatment chamber.

In the present example, the flow rate of $O_2$ is held at zero at any time period.

During the preheating time period T1, the radiofrequency power is held at a constant value P41 larger than zero. The $N_2$ flow rate is held at a constant value F41 larger than zero and the $SiH_4$ flow rate is held at zero. Accordingly, a film is not deposited on the wafer.

During the film formation time period T2, the $N_2$ flow rate is held at a constant value F42 smaller than the initial flow rate F41. The $SiH_4$ flow rate is held at a constant value larger than zero throughout the film formation time period T2. The radiofrequency power increases monotonically (linearly in the example in FIG. 9) from an initial value P42 and reaches a predetermined value P43 (>P42) at the end of the film formation time period T2.

Thus, an $SiN_x$ film is deposited (here, x>0) during the film formation time period T2, and the N composition x varies in the film thickness direction depending on the radiofrequency power. More specifically, an $SiN_x$ film in which the N composition x increases with time during the film formation time period T2 is formed. Accordingly, the N composition x increases monotonically (e.g., linearly) as film formation proceeds. In such a manner, the diffraction/scattering film 11 is constituted of an $SiN_x$ film, and the N composition x has a gradient in the film thickness direction. More specifically, the N composition x of the $SiN_x$ film increases monotonically from the substrate 2 toward the light emitting layer 4. Since the etching rate of $SiN_x$ depends on the N composition x, the etching rate of the diffraction/scattering film 11 varies in the film thickness direction. Thus, a protruding portion 11A (see FIGS. 2A and 2B and the like) having a side surface 11a slanted depending on a gradient of the N composition x can be formed.

During the cooling time period T3, the $N_2$ flow rate is held at a predetermined flow rate F44 (>F42) and the $SiH_4$ flow rate is set at zero. The radiofrequency power is set at zero. This allows $N_2$ to be sent into the treatment chamber at a high flow rate so as to cool the inside of the treatment chamber.

Figure 10:
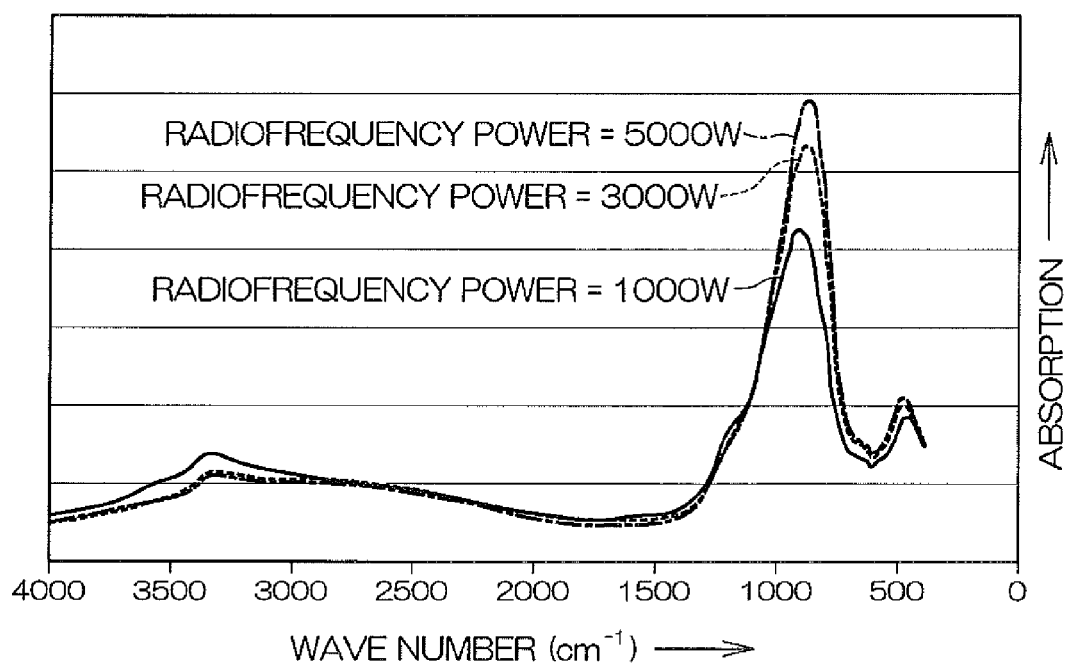
FIG. 10 shows an infrared spectrum of a film obtained by forming $SiN_x$ by a plasma CVD method while setting radiofrequency power at various values.

FIG. 10 shows an infrared spectrum of a film obtained by forming $SiN_x$ by a plasma CVD method while setting the radiofrequency power at various values. FIG. 10 shows that the N composition x can be increased as the radiofrequency power is increased. Accordingly, by fluctuating the radiofrequency power during a film formation time period in formation of an $SiN_x$ film by a plasma CVD method, it is possible to make a gradient in the N composition in the film thickness direction.

Figure 11A:
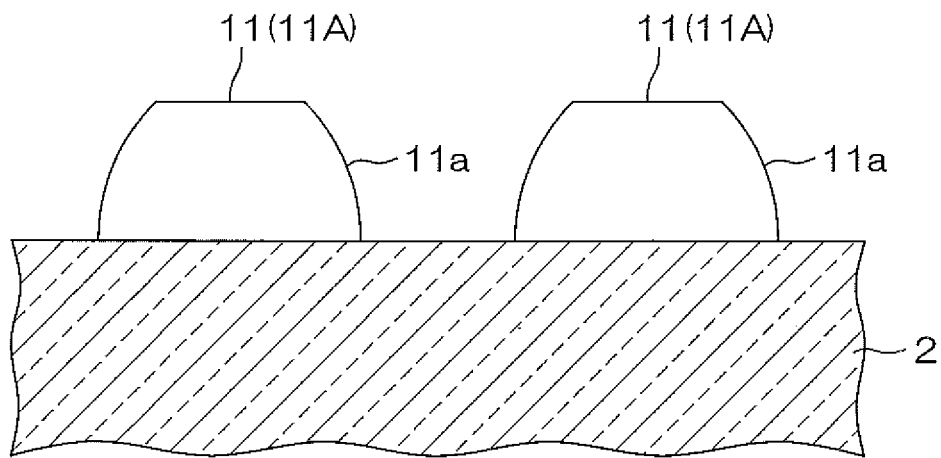
FIGS. 11A and 11B show other examples of a shape of a diffraction/scattering film.
Figure 11B:
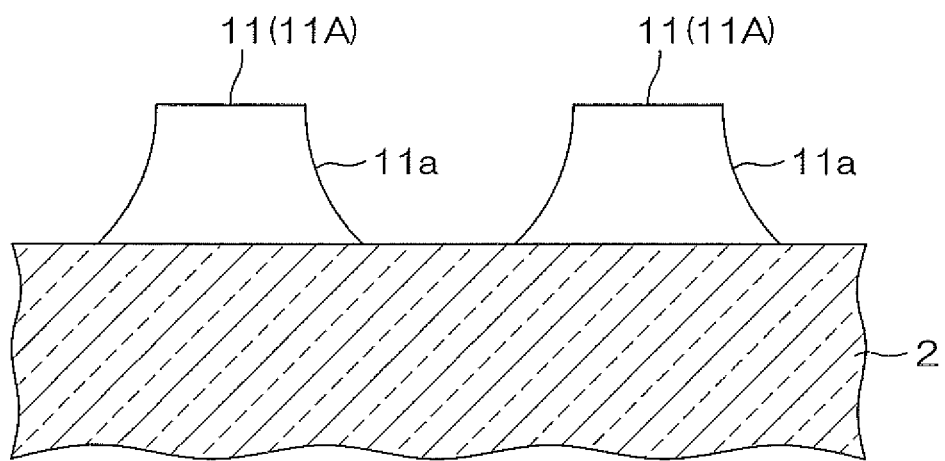

Although the above description has explained some preferred embodiments of the present invention, the present invention can be implemented in other preferred embodiments. For example, although the above description on the preferred embodiments has explained an example in which the side surface 11a of the diffraction/scattering film 11 is linear in a cutting plane vertical to the major surface of the film, a side surface 11a may be a convex curved surface having a cross section vertical to the major surface in an outward convex curve as illustrated in FIG. 11A. Moreover, a side surface 11a may also be a concave curved surface having a cross section vertical to the major surface in an inward concave curve as illustrated in FIG. 11B. A side surface 11a having such a shape can be realized by controlling the flow ratio of $N_2$ and $O_2$ or controlling the radiofrequency power during film formation. For example, the $N_2$ flow rate, the $O_2$ flow rate, the radiofrequency power or the like may be varied non-linearly during the film formation time period.

Although the above description on the preferred embodiments has explained an example in which the diffraction/scattering film 11 is etched by plasma etching, a diffraction/scattering film 11 may be etched by another dry etching method or by a wet etching method.

Although the above description on the preferred embodiments has explained an example in which a protruding portion 11A of a diffraction/scattering film 11 has a hexagonal truncated pyramid shape, a protruding portion 11A may have another shape such as a circular truncated cone shape, a polygonal truncated pyramid shape having an arbitrary number of corners (e.g., triangle, quadrangle, hexagon or the like), a circular cone shape, a polygonal truncated pyramid shape having an arbitrary number of corners, or a strip shape having a slanted side surface.

Although GaN is used as a nitride semiconductor in the preferred embodiments above, a nitride semiconductor is a semiconductor using nitrogen as a V group element in a III-V group semiconductor, and therefore may be made of aluminum nitride (AlN), indium nitride (InN) or the like, which are typical examples, instead of gallium nitride (GaN). Generally, a nitride semiconductor can be represented as $Al_xIn_yGa_{1-x-y}N$ ($0 \le X \le 1$, $0 \le Y \le 1$ and $0 \le X+Y \le 1$).

Although a semiconductor light emitting device is designed to extract light from the substrate side in the preferred embodiments above, the present invention can be applied to a semiconductor light emitting device designed to extract light from the opposite side of the substrate. In such a case, the reflecting electrode layer 7 in the arrangement in FIG. 1 may be omitted and a reflecting layer may be formed at the rear surface 2A of the substrate 2 instead, for example.

Although a nitride semiconductor is used in a semiconductor light emitting device in the preferred embodiments above, the present invention may be applied to a semiconductor light emitting device using a semiconductor material other than a nitride semiconductor.

The present application corresponds to Japanese Patent Application No. 2012-199629 filed in the Japan Patent Office on Sep. 11, 2012, and the entire disclosure of the application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor light emitting device comprising:
a substrate;
a semiconductor layer which is formed on the substrate and includes a light emitting layer; and
a diffraction/scattering film, which is formed between the light emitting layer and the substrate, for diffracting or scattering light generated at the light emitting layer, the diffraction/scattering film having a side surface slanted with respect to a film thickness direction thereof and having a composition gradient in the film thickness direction, the diffraction/scattering film including a film portion having a gradient oxygen composition which decreases monotonically from the substrate toward the light emitting layer.

2. The semiconductor light emitting device according to claim 1, wherein the diffraction/scattering film includes silicon and nitrogen, and a composition of nitrogen has a gradient in the film thickness direction.

3. A semiconductor light emitting device comprising:
a substrate;
a semiconductor layer which is formed on the substrate and includes a light emitting layer; and
a diffraction/scattering film, which is formed between the light emitting layer and the substrate, for diffracting or scattering light generated at the light emitting layer, the diffraction/scattering film having a side surface slanted with respect to a film thickness direction thereof and having a composition gradient in the film thickness direction,
wherein the diffraction/scattering film includes a film portion having a linear-gradient composition in the film thickness direction.

4. The semiconductor light emitting device according to claim 1, wherein the diffraction/scattering film includes a film portion having a composition varying in the film thickness direction from $SiO_2$ to SiN.

5. The semiconductor light emitting device according to claim 1, wherein the diffraction/scattering film includes a film portion having a composition varying in the film thickness direction from SiON to SiN.

6. The semiconductor light emitting device according to claim 1, wherein the diffraction/scattering film includes a film portion of $SiO_aN_b$ in which a composition a (a>0) of oxygen and a composition b (b>0) of nitrogen vary in the film thickness direction.

7. The semiconductor light emitting device according to claim 1, wherein the diffraction/scattering film includes a film portion of $SiN_x$ having a nitrogen composition x varying in the film thickness direction.

8. The semiconductor light emitting device according to claim 1, wherein the diffraction/scattering film includes a film portion having a gradient nitrogen composition which increases monotonically from the substrate toward the light emitting layer.

9. The semiconductor light emitting device according to claim 1, wherein the diffraction/scattering film includes a film portion having an oxygen composition larger than a nitrogen composition.

10. The semiconductor light emitting device according to claim 1, wherein the diffraction/scattering film includes a film portion having a nitrogen composition larger than an oxygen composition.

11. The semiconductor light emitting device according to claim 1, wherein the diffraction/scattering film has a constant silicon composition in the film thickness direction.

12. A semiconductor light emitting device comprising:
a substrate;
a semiconductor layer which is formed on the substrate and includes a light emitting layer; and
a diffraction/scattering film, which is formed between the light emitting layer and the substrate, for diffracting or scattering light generated at the light emitting layer, the diffraction/scattering film having a side surface slanted with respect to a film thickness direction thereof and having a composition gradient in the film thickness direction,
wherein the diffraction/scattering film includes a film portion having a composition varying in the film thickness direction from $SiO_2$ to SiON.

13. The semiconductor light emitting device according to claim 12, wherein the diffraction/scattering film includes a film portion having a gradient oxygen composition which decreases monotonically from the substrate toward the light emitting layer.

14. The semiconductor light emitting device according to claim 3, wherein the diffraction/scattering film includes silicon, nitrogen and oxygen, and a composition of nitrogen and a composition of oxygen have a gradient in the film thickness direction.

* * * * *